(12) United States Patent
Chen et al.

(10) Patent No.: US 7,544,529 B2
(45) Date of Patent: Jun. 9, 2009

(54) IMAGE SENSOR PACKAGING STRUCTURE AND METHOD OF MANUFACTURING THE SAME

(75) Inventors: Shou-Lung Chen, Troyuan (TW); Fang-Jun Leu, Hsinchu (TW); Shan-Pu Yu, Taoyeng (TW)

(73) Assignee: Industrial Technology Research Institute, Hsinchu (TW)

( * ) Notice: Subject to any disclaimer, the term of this patent is extended or adjusted under 35 U.S.C. 154(b) by 85 days.

(21) Appl. No.: 11/678,101

(22) Filed: Feb. 23, 2007

(65) Prior Publication Data

US 2007/0190687 A1 Aug. 16, 2007

Related U.S. Application Data

(60) Division of application No. 11/222,173, filed on Sep. 8, 2005, now Pat. No. 7,417,293, which is a continuation-in-part of application No. 10/833,713, filed on Apr. 27, 2004, now abandoned.

(51) Int. Cl.
*H01L 21/00* (2006.01)

(52) U.S. Cl. .............. 438/31; 438/16; 438/107; 438/108; 257/E21.499; 257/E21.513

(58) Field of Classification Search .............. 438/55, 438/116; 257/E21.512, E21.513
See application file for complete search history.

(56) References Cited

U.S. PATENT DOCUMENTS

| | | | |
|---|---|---|---|
| 5,463,229 A | 10/1995 | Takese et al. | |
| 5,869,896 A | 2/1999 | Baker et al. | |
| 6,833,612 B2 | 12/2004 | Kinsman | |
| 2002/0096730 A1 | 7/2002 | Tu et al. | |
| 2004/0056365 A1 | 3/2004 | Kinsman | |
| 2004/0189854 A1 | 9/2004 | Tsukamoto et al. | |
| 2005/0048692 A1 | 3/2005 | Hanada | |

*Primary Examiner*—Alexander G Ghyka
*Assistant Examiner*—Cheung Lee
(74) *Attorney, Agent, or Firm*—Alston & Bird LLP

(57) ABSTRACT

An image sensor module includes a first substrate, a second substrate provided over the first substrate, an image sensor device for receiving an image signal flip-chip bonded to the second substrate, and a semiconductor device for processing the image signal from the image sensor device embedded in the first substrate.

8 Claims, 13 Drawing Sheets

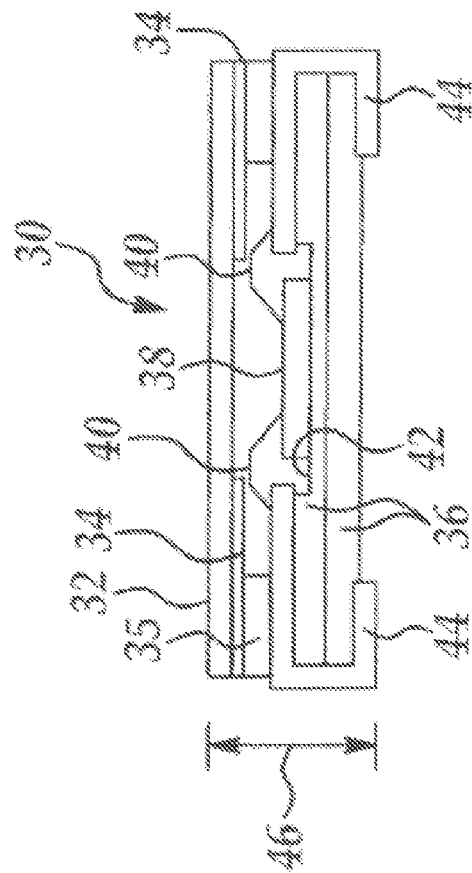
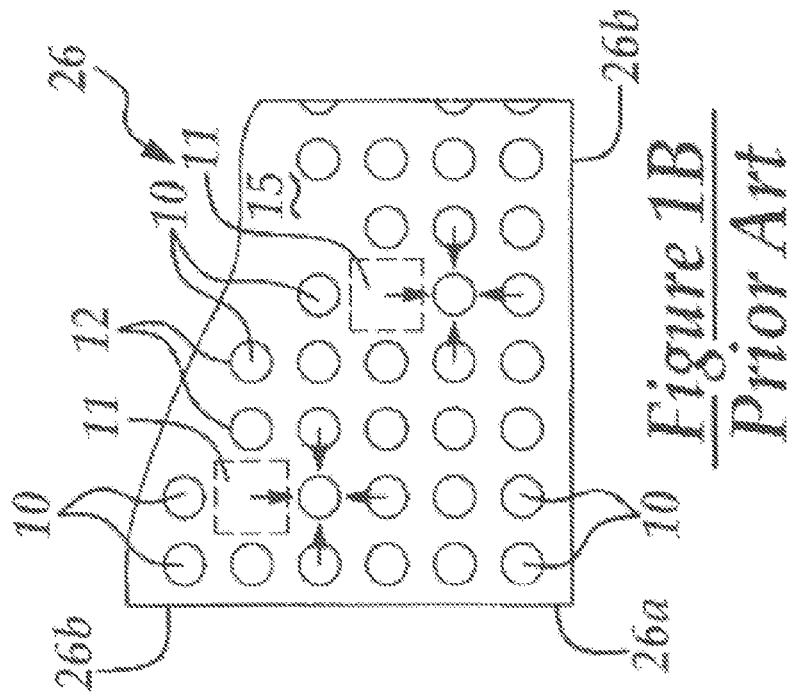

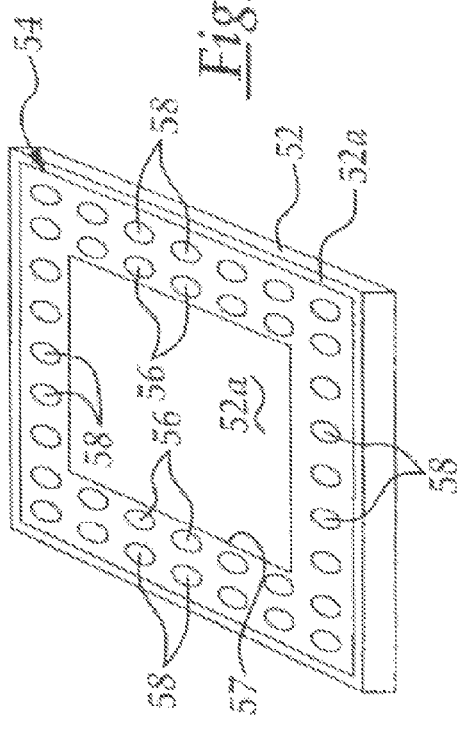
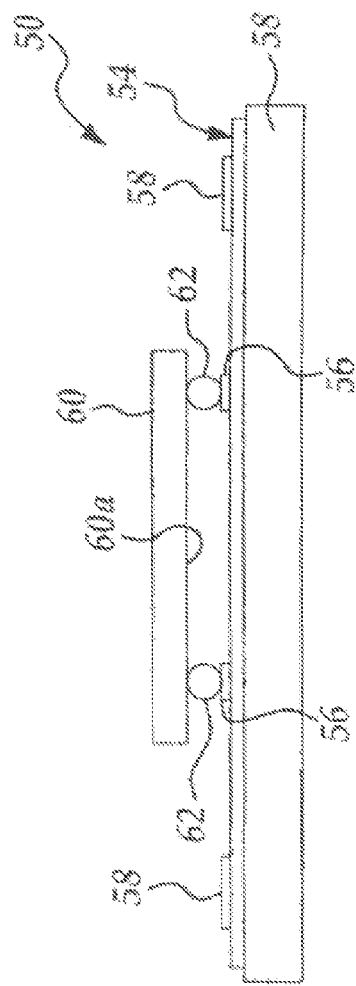

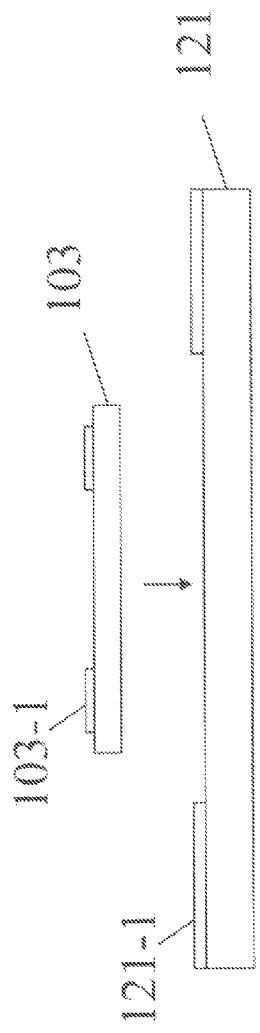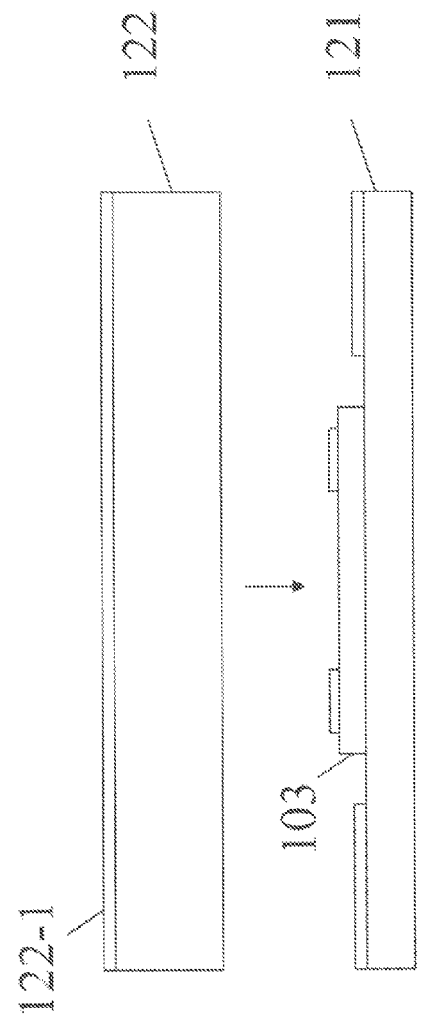

IMAGE SENSOR PACKAGING STRUCTURE AND METHOD OF MANUFACTURING THE SAME

CROSS-REFERENCE TO RELATED APPLICATIONS

This application is a divisional of U.S. patent application Ser. No. 11/222,173, filed Sep. 8, 2005 which is a continuation-in-part of U.S. patent application Ser. No. 10/833,713, filed Apr. 27, 2004, which is herein incorporated by reference in its entirety.

BACKGROUND OF THE INVENTION

The present invention generally relates to semiconductor integrated circuits ("ICs") assembly and, more particularly, to an image sensor packaging structure and a method of manufacturing the same.

One of the important processes at the final stage of fabricating semiconductor integrated circuits ("ICs") is multi-leveled packaging, which includes expanding the pitch between electrodes of an IC chip for subsequent processing. The multi-leveled packaging protects an IC chip from internal or external stress, provides thermal paths for dissipating heat generated within the chip, and forms electronic interconnections. The method for packaging an IC chip may concern the overall cost of the IC, and in addition, may affect the performance and reliability of the IC and in turn the system using the IC.

Packaged IC chips may be generally divided into two types, that is, hermetic package and non-hermetic package. A hermetic-package IC chip refers to one isolated from an external environment by, for example, a vacuum-tight enclosure. The material for a hermetic package may typically include ceramic, which is suitable for high-performance applications such as image sensors or pressure sensors. A non-hermetic-package IC chip, on the other hand, refers to one not completely isolated from an external environment. The manufacturing cost of a hermetic package is higher than that of a non-hermetic package. Recent advances in hermetic package include the use of plastic material, which has expanded the field of application and enhanced the performance capability of hermetic package. Plastic packages are cost-effective due to the use of automated batch-handling in their manufacturing processes.

A recent development in assembly technique is ball grid array ("BGA") package, which is applicable to both ceramic and plastic packages and includes various types of internal package structures. A BGA package uses multiple solder balls or bumps for electrical, mechanical and thermal interconnections between an IC chip and other microelectronic devices. Solder bumps function to mechanically secure an IC chip to a circuit board and electrically connect the IC chip to a conductor pattern formed on the circuit board. The BGA technique is known as one belongs to the Controlled Collapse Chip Connection (C4) or flip-chip technology.

The flip chip technology may be used in conjunction with various types of circuit boards, including ceramic substrates, printed wiring boards, flexible circuits and silicon substrates. The solder bumps, typically arranged in an array surrounding a flip chip, are formed on electrically conductive bond pads which in turn electrically interconnect the circuitry of the flip chip. A relatively large number of solder bumps are often required to support the functions performed by the circuitry of the flip chip. As an example of a flip chip having a size of approximately thirteen millimeters per side, the large number of solder bumps are crowded along the perimeter of the chip with their conductors being spaced apart from each other by a pitch of approximately 0.1 millimeter or less.

FIG. 1 is a schematic diagram of a section of a conventional flip chip 26. Referring to FIG. 1, flip chip 26 includes a solder bump 10 soldered directly to an upper surface of a bump pad 14, which has a rectangular shape, as shown in FIG. 1A, and is partially covered by a passivation layer 12 of, for example, SiN or $SiO_2$. A circular pad opening 13 formed in passivation layer 12 exposes bump pad 14 on which solder bump 14 is formed. Bump pad 14 is surrounded by a dielectric layer 15 such as an oxide layer formed in flip chip 26. Bump pad 14 forms an electrical contact with an upper conductive layer 16, which is separated from underlying conductive layers 22 by an insulative layer 18. Upper and underlying conductive layers 16 and 22 are electrically connected to each another through conductive vias 20 extending through insulative layers 18. Insulative layers 18 and underlying conductive layers 22 are sequentially deposited over a silicon chip substrate 24 by a conventional technique during semiconductor fabrication.

After solder bumps 10 are formed, flip chip 26 is flipped over to allow solder bumps 10 to be bonded to electrical terminals disposed on another substrate such as a printed circuit board ("PCB"). Referring to FIG. 1B, solder bumps are formed on flip chip 26 in rows and columns. Empty spaces 11 are provided in the rows and columns to allow for the configuration of ICs formed on silicon chip substrate 24. After solder bumps 10 are bonded to a PCB substrate 28, flip chip 26 is subjected to a variety of tests such as bump shear tests and die shear tests by applying shear stress thereto in order to determine the mechanical integrity of electrical connections formed between flip chip 26 and PCB substrate 28. Furthermore, flip chip 26 may be subjected to temperature tests of approximately 150° C. For high-performance electronic devices such as CCD (Charged Coupled Device) image sensors or CMOS (Complementary Metal-Oxide-Semiconductor) image sensors, however, leadless chip carrier packages may be more commonly used than flip chip packages.

A CCD image sensor refers to an electronic device capable of transforming a light pattern or image into an electric charge pattern or electronic image. A CCD includes several photosensitive elements for collecting, storing and transporting electrical charge from one photosensitive element to another. With its photosensitive properties, silicon is a suitable material in the design of image sensors. Each of the photosensitive elements represents a picture element or pixel. In accordance with semiconductor technology and design rules, the pixels in structure are generally formed in lines or matrices. At least one output amplifier provided at a side of an image sensor chip collects signals from the CCD. An electronic image is obtained by applying to the at least one output amplifier a series of pulses, which transfer the charge of a pixel one after another, line after line. The at least one output amplifier converts the charge into a voltage signal. External electronics transform the voltage signal into one suitable for use in monitors or frame grabbers.

A CMOS image sensor operates at a lower voltage level than a CCD image sensor, and therefore is suitable for portable applications due to lower power consumption. Each CMOS active sensor cell, which can be addressed and read individually, includes a buffer amplifier and generally four transistors and a photo-sensing element. Each sensor cell also includes a transfer gate separating a photo sensor from a capacitive "floating diffusion", a source-follower transistor to buffer the floating diffusion from readout-line capacitance, and a row-select gate to connect the cell to the readout line.

All of the pixels disposed in a column are connected to a sense amplifier. In addition to the advantage of lower power consumption, a CMOS image sensor generally has a less complicated design than a CCD image sensor, and therefore requires less support circuitry than a CCD image sensor.

FIG. 1C is a cross-sectional diagram of a conventional leadless chip carrier package 30. Referring to FIG. 1C, leadless chip carrier package 30, generally used to package a CCD or CMOS image sensor IC chip, includes a layer of transparent cover glass 32 provided on a support layer 35. An anti-reflective coat 34 is provided between cover glass 32 and support layer 35. A multi-layered substrate 36 includes a castellation 42 on which an image sensor die 38 is located. Top leads 40, extending from die 38, are disposed in electrical contact with bottom leads 44, which wrap around sides and a partial bottom surface of multi-layered substrate 36. Transparent cover glass 32 facilitates the transmission of light toward image sensor die 38.

Leadless chip carrier package 30, which may have a thickness 46 of approximately 2 mm (millimeter), if used to package an image sensor, may disadvantageously consume a relatively large space, resulting in an unduly large image sensor device and in turn an excessively large module including such an image sensor and other electronic devices. It is therefore desirable to provide a structure and method for packaging an image sensor and a module in an acceptable profile.

BRIEF SUMMARY OF THE INVENTION

The present invention is directed to a structure and method that obviate one or more problems resulting from the limitations and disadvantages of the prior art.

In accordance with an embodiment of the present invention, there is provided an image sensor module that comprises a first substrate, a second substrate provided over the first substrate, an image sensor device for receiving an image signal flip-chip bonded to the second substrate, and a semiconductor device for processing the image signal from the image sensor device embedded in the first substrate.

Also in accordance with the present invention, there is provided an image sensor module that comprises a first substrate including a first surface and a second surface, a second substrate including a first surface and a second surface, an image sensor device for receiving an image signal formed between the first substrate and the second substrate, and a semiconductor device for processing the image signal from the image sensor device embedded in the first substrate.

Further in accordance with the present invention, there is provided a method for packaging an image sensor module that comprises providing a first substrate, providing a second substrate, flip-chip bonding an image sensor device to the second substrate for receiving an image signal, and embedding a semiconductor device in the first substrate for processing the image signal from the image sensor device.

Still in accordance with the present invention, there is provided a method for packaging an image sensor module that comprises providing a first substrate, attaching a semiconductor device onto the first substrate, forming a dielectric layer on the first substrate attached with the semiconductor device, patterning and etching the dielectric layer to expose parts of the first substrate and the semiconductor device, forming a conductive layer on the dielectric layer to cover at least one of the exposed parts, providing a second substrate, flip-chip bonding an image sensor device to the second substrate, and electrically connecting the image sensor and the semiconductor device.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 1B is a top view of a part of a conventional flip chip having multiple solder bumps arranged in rows on the flip chip;

FIG. 1C is a cross-sectional view of a conventional leadless chip carrier package for packaging an image sensor;

FIG. 2B is a perspective view of a bond pad film provided on a glass substrate;

FIGS. 2C, 2D and 2E are diagrams of an image sensor package structure in accordance with one embodiment of the present invention;

FIGS. 6A to 6D are diagrams illustrating a method for manufacturing a built-in device in accordance with one embodiment of the present invention.

DETAILED DESCRIPTION OF THE INVENTION

The present invention provides a structure and method for packaging an image sensor integrated circuit ("IC") chip. The structure includes a flip chip ball grid array ("BGA") packaging structure, which may be more area efficient than conventional packaging structures for image sensors and therefore allows an image sensor to be designed in smaller size than that of the conventional packaging structures. Furthermore, the packaging structure according to the present invention is applicable to charge-coupled device ("CCD") image sensors and complementary metal-oxide-semiconductor ("CMOS") image sensors.

Figure 1A:
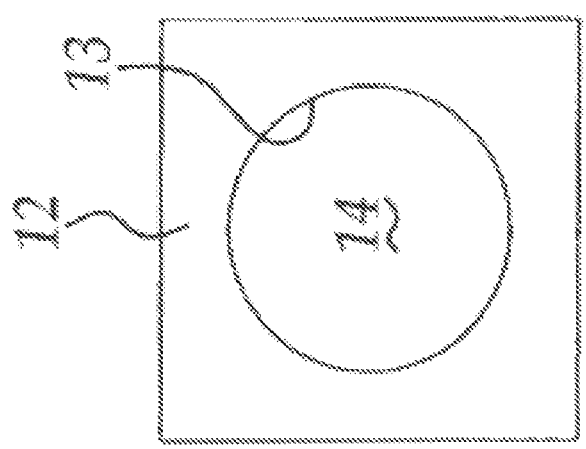
FIG. 1A is a top schematic view of a solder bump and bump pad construction of a conventional semiconductor flip chip.
Figure 1:
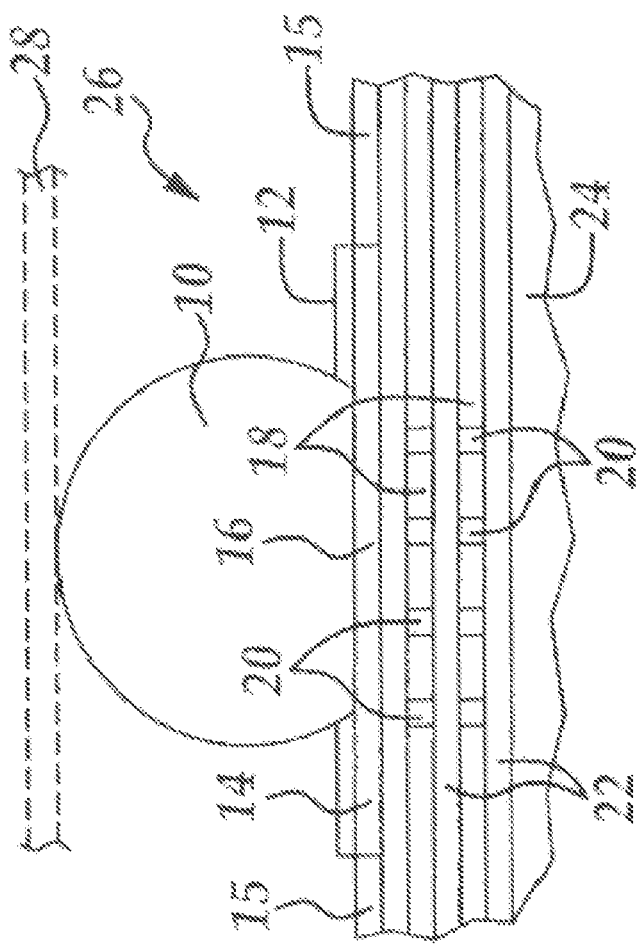
FIG. 1 is a schematic diagram of a section of a conventional flip chip.
Figure 2A:
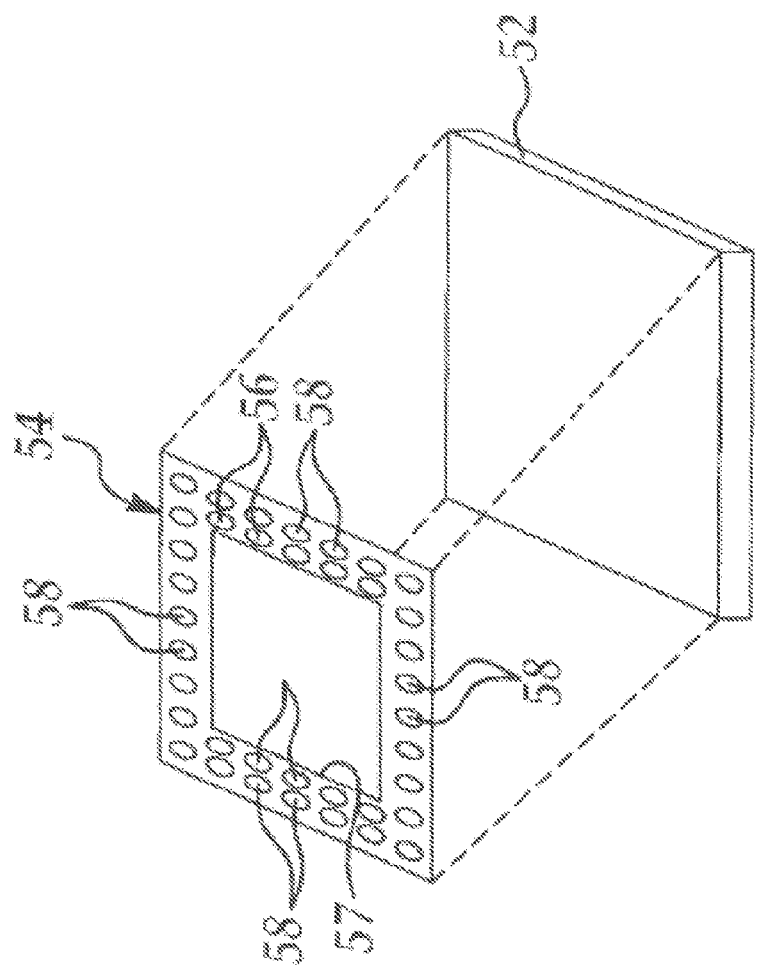
FIG. 2A is an exploded, perspective view of a bond pad film on which multiple interior flip-chip bond pads and exterior ball grid array ("BGA") bond pads are formed.
Figure 2D:
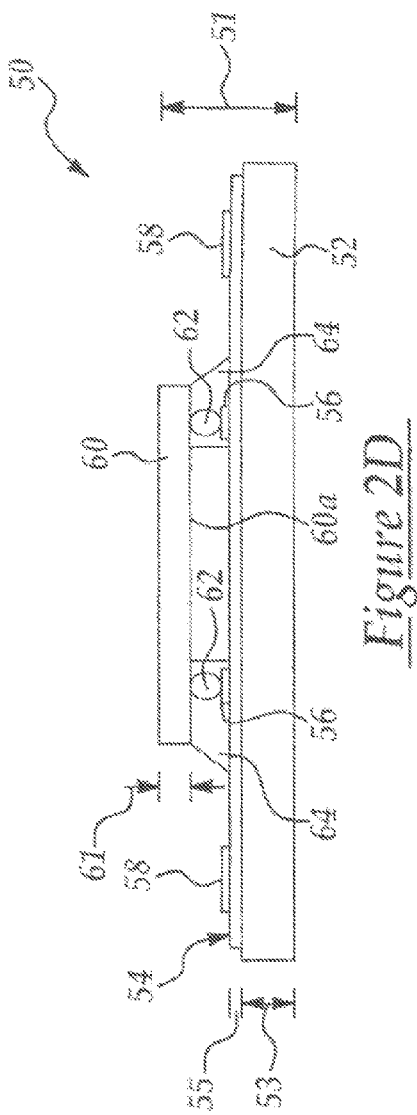
Figure 2E:
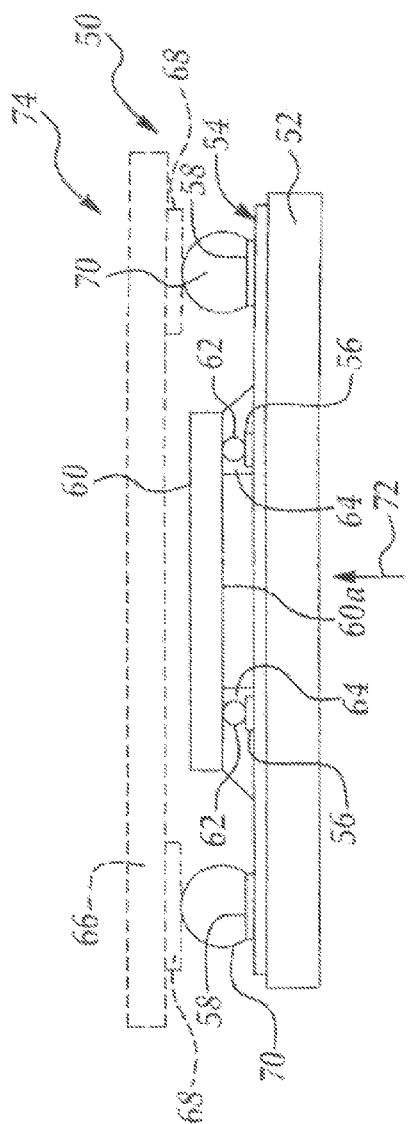

FIGS. 2D and 2E illustrate an image sensor packaging structure 50 in accordance with one embodiment of the present invention. Referring to FIGS. 2D and 2E, packaging structure 50 includes a glass substrate 52 and a bond pad film 54 such as a polyimide ("PI") film formed on glass substrate 50. Glass substrate 52 has a thickness 53 ranging from approximately 400 μm to 600 μm, and bond pad film 54 has a thickness of approximately 100 μm. A plurality of interior flip-chip bond pads 56 and exterior BGA bond pads 58 are formed on an upper surface of bond pad film 54. Each of interior bond pads 56 may be electrically patterned to one of exterior bond pads 58. An interior solder bump 62, which may be made of tin, lead or a mixture thereof, is bonded to one of interior bond pads 56. An exterior solder ball 70, which generally includes the same material as interior solder bump 62, is bonded to one of exterior bond pads 58.

A CCD or CMOS image sensor IC chip 60 is bonded to interior solder bumps 62. Referring to FIG. 2D, IC chip 60, having a thickness 61 of approximately 250 μm, includes a light receiving face 60a facing glass substrate 52 through a film window 57 (shown in FIG. 2B) provided in a center region of bond pad film 54. As a result, image sensor IC chip 60 is positioned to receive an image 72 through glass substrate 52 and film window 57. A printed circuit board ("PCB") substrate 66 is bonded to exterior solder balls 70 via respective bond pads 68 formed on PCB substrate 66. PCB substrate 66 may further include electronic devices required to transform image 72 received by image sensor IC chip 60 into an output signal suitable for use with a monitor or frame grabber. An underfill material 64 may be applied between bond pad film 54 and IC chip 60 to cover interior bond pads 56 and solder bumps 62.

Referring to FIG. 2A, bond pad film 54, generally having a rectangular shape, may include a PI tape. Film window 57, generally having a rectangular shape, extends through the center region of bond pad film 54. Exterior bond pads 58 are arranged in rows along edges of bond pad film 54. Interior bond pads 56 are arranged in rows and extend in parallel to the rows of exterior bond pads 58 along a pair of edges of film window 57. Bond pad film 54 is provided on an upper surface of glass substrate 52. As shown in FIG. 2B, an anti-reflective infrared (IR) coating or lens 52a is provided on the upper surface of glass substrate 52.

Referring to FIG. 2C, after bond pad film 54 is provided on glass substrate 52, each of interior solder bumps 62 made of, for example, tin/lead, is formed on a corresponding one of interior bond pads 56. Image sensor IC chip 60 is then inverted and bonded to interior solder bumps 62. As a result, light receiving face 60a of IC chip 60 faces upper surface 52a of glass substrate 52 through film window 57.

Referring again to FIG. 2D, underfill material 64 is applied between bond pad film 54 and IC chip 60 to cover each of interior solder bumps 62. Underfill material 64 protects interior bond pads 56 and interior solder bumps 62 from dust, moisture and other contaminants, and enhances the reliability of electrical interconnection between interior bond pads 56 and IC chip 60. Furthermore, underfill material 64 may include epoxy with fine-scale fillers to facilitate thermal dissipation.

Referring again to FIG. 2E, after underfill material 64 is applied, exterior solder balls 70 are formed on corresponding exterior bond pads 58. Bond pads 68 formed on PCB substrate 66 are then bonded to corresponding exterior solder balls 70 to form image sensor device 74.

The thickness 51 of image sensor packaging structure 50 shown in FIG. 2D ranges from approximately 800 μm to 1400 μm, which is smaller than that, approximately 2 mm, of a conventional image sensor packaging structure. Image sensor device 74 therefore may be designed in a smaller size.

Figure 3:
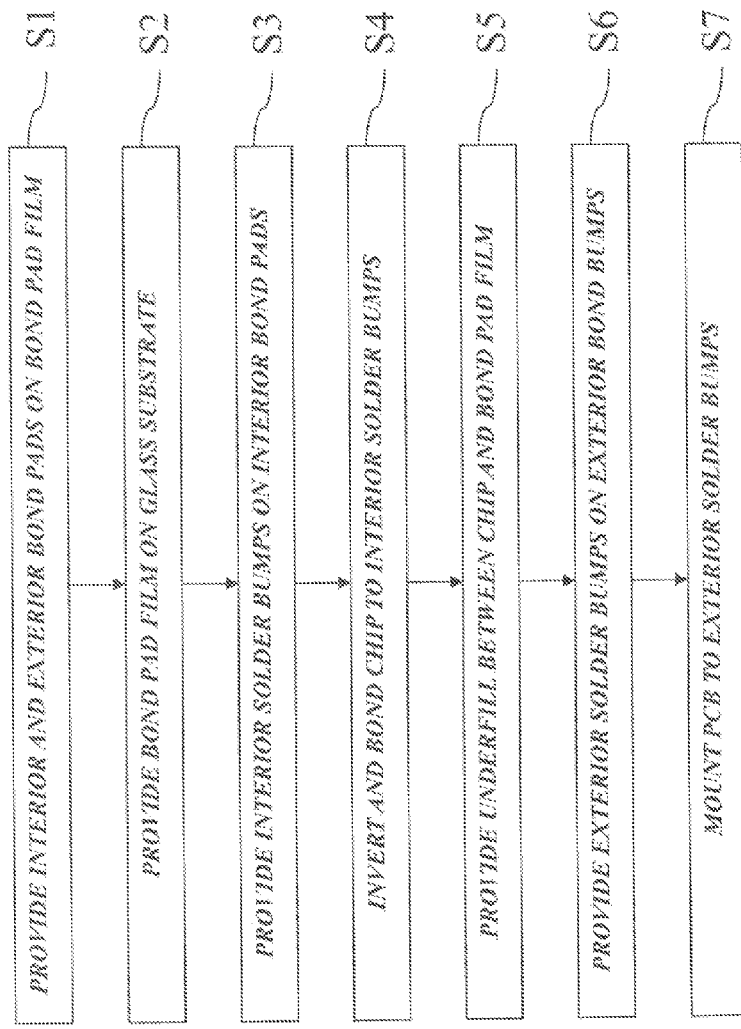
FIG. 3 is a flow diagram illustrating a method for packaging an image sensor in accordance with one embodiment of the present invention.

FIG. 3 is a flow diagram illustrating a method for packaging an image sensor in accordance with one embodiment of the present invention. At step S1, interior and exterior bond pads are formed on a bond pad film. At step S2, the bond pad film is formed on a glass substrate. Next, at step S3, interior solder bumps are provided on the interior bond pads of the bond pad film. At step S4, an image sensor IC chip is inverted and bonded to the interior solder bumps. Next, at step S5, an underfill material is applied between the IC chip and the bond pad film to protect the interior bond pads and solder bumps from dust, moisture and other contaminants. At step S6, exterior solder balls are provided on corresponding exterior bond pads of the bond pad film. At step S7, a PCB substrate is mounted to the exterior solder balls.

Figure 4A:
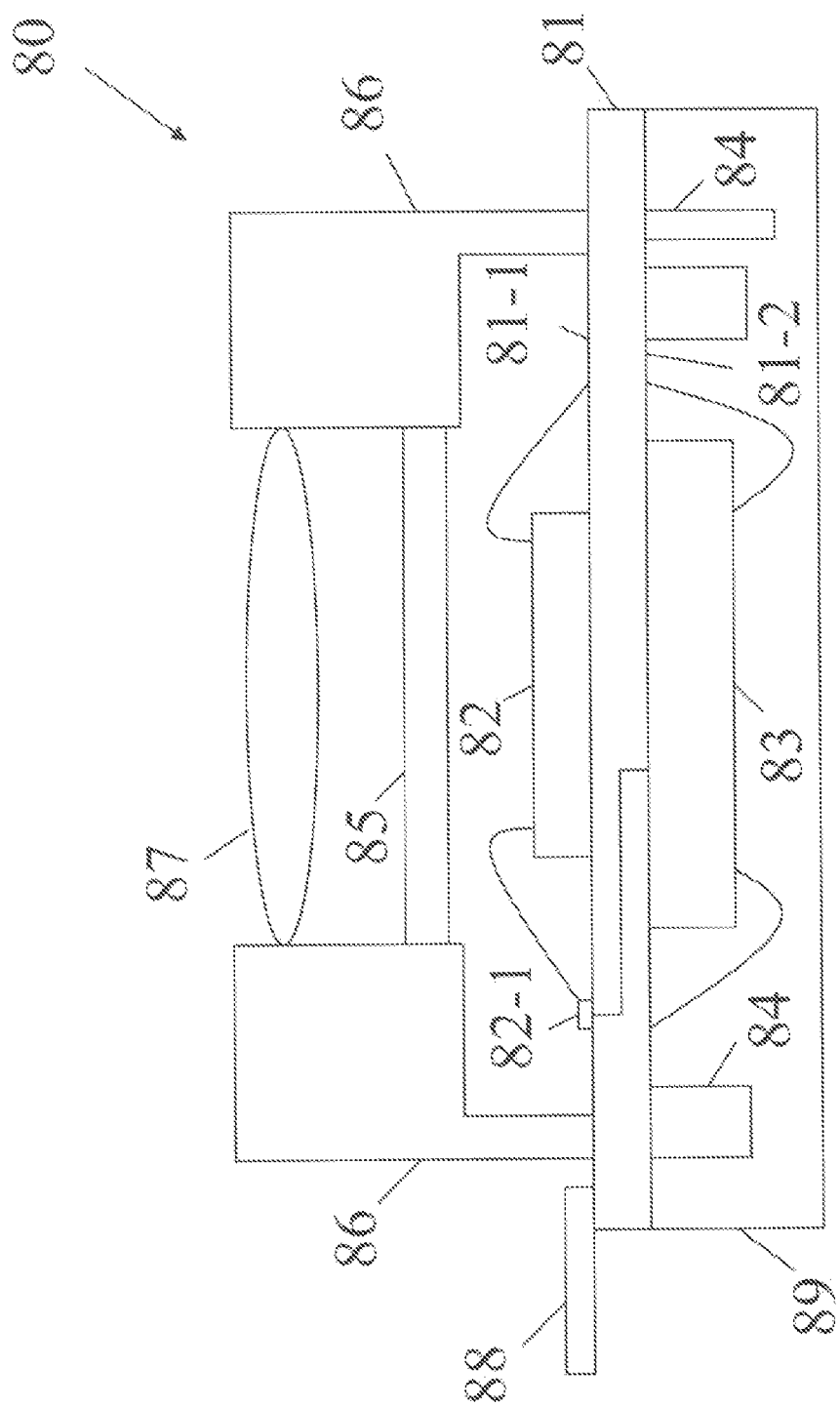
FIG. 4A is a schematic diagram of an image sensor module in accordance with one embodiment of the present invention.

FIG. 4A is a schematic diagram of an image sensor module 80 in accordance with one embodiment of the present invention. Referring to FIG. 4A, image sensor module 80 includes a substrate 81, an image sensor device 82, a semiconductor device 83 and at least one passive component 84. Image sensor 82, formed on a first surface 81-1 of substrate 81, receives an image signal (not shown) transmitted through a lens 87 and a transparent plate 85, for example, a glass plate. Semiconductor device 83, formed on a second surface 81-2 of substrate 81, includes one of an active device such as an image signal processor ("ISP") or a digital signal processor ("DSP") for converting the image signal from image sensor device 82 to a digital signal, or a storage device such as a static random access memory ("SRAM") device for temporarily storing the image signal or a flash memory device for storing the image signal for a predetermined duration of time. Image sensor 82 is electrically connected to semiconductor device 83 through at least one conductive path (not numbered) provided in substrate 81. An image signal received by image sensor device 82 transmits through a conductive wire (not numbered) bonded to a pad 82-1 formed on first surface 81-1 and through the conductive path to semiconductor device 83. In other embodiments according to the present invention, the conductive wire is bonded to a trace electrically connected to pad 82-1 instead of directly being bonded to pad 82-1. The at least one passive component 84, including, for example, one of a resistor, a capacitor or an inductor, functions to further process, for example, filter the digital signal from semiconductor device 83 before it is output via a flexible printed circuit ("FPC") 88.

Image sensor module further includes a holder 86 for holding lens 87 and transparent plate 85. In another embodiment according to the present invention, lens 87 is held by holder 86 while transparent plate 85 is adhesively adhered to holder 86. Semiconductor device 83 and the at least one passive component 84 are encapsulated in a layer of plastic resin 89.

Figure 4B:
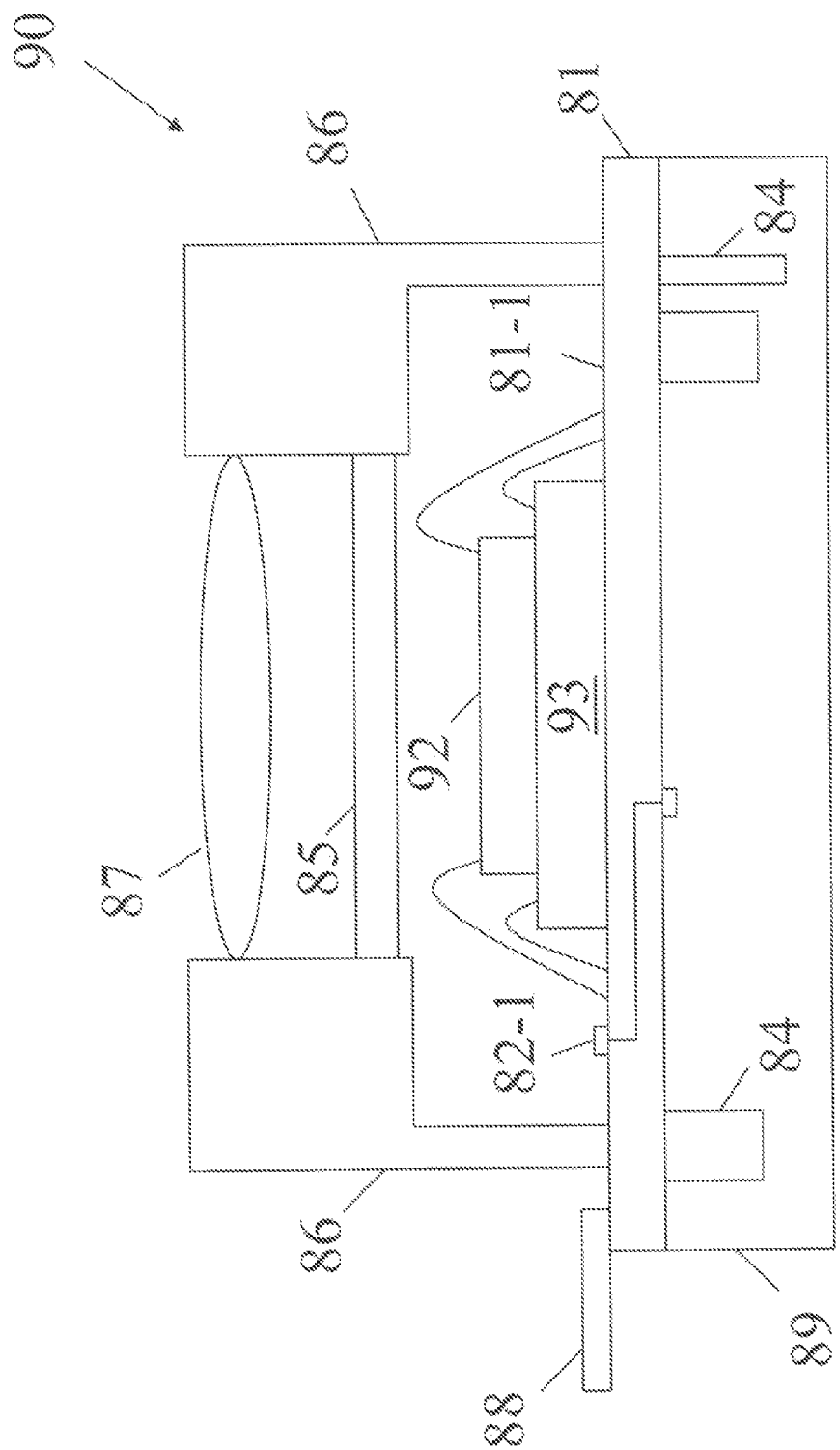
FIG. 4B is a schematic diagram of an image sensor module in accordance with another embodiment of the present invention.

FIG. 4B is a schematic diagram of an image sensor module 90 in accordance with another embodiment of the present invention. Referring to FIG. 4B, image sensor module 90 includes a substrate 81, an image sensor device 92, a semiconductor device 93 and at least one passive component 84. Image sensor module 90 is similar in structure to image sensor module 80 shown in FIG. 4A except that image sensor device 92 is stacked on semiconductor device 93, which are formed on first surface 81-1 of substrate 81.

Figure 5:
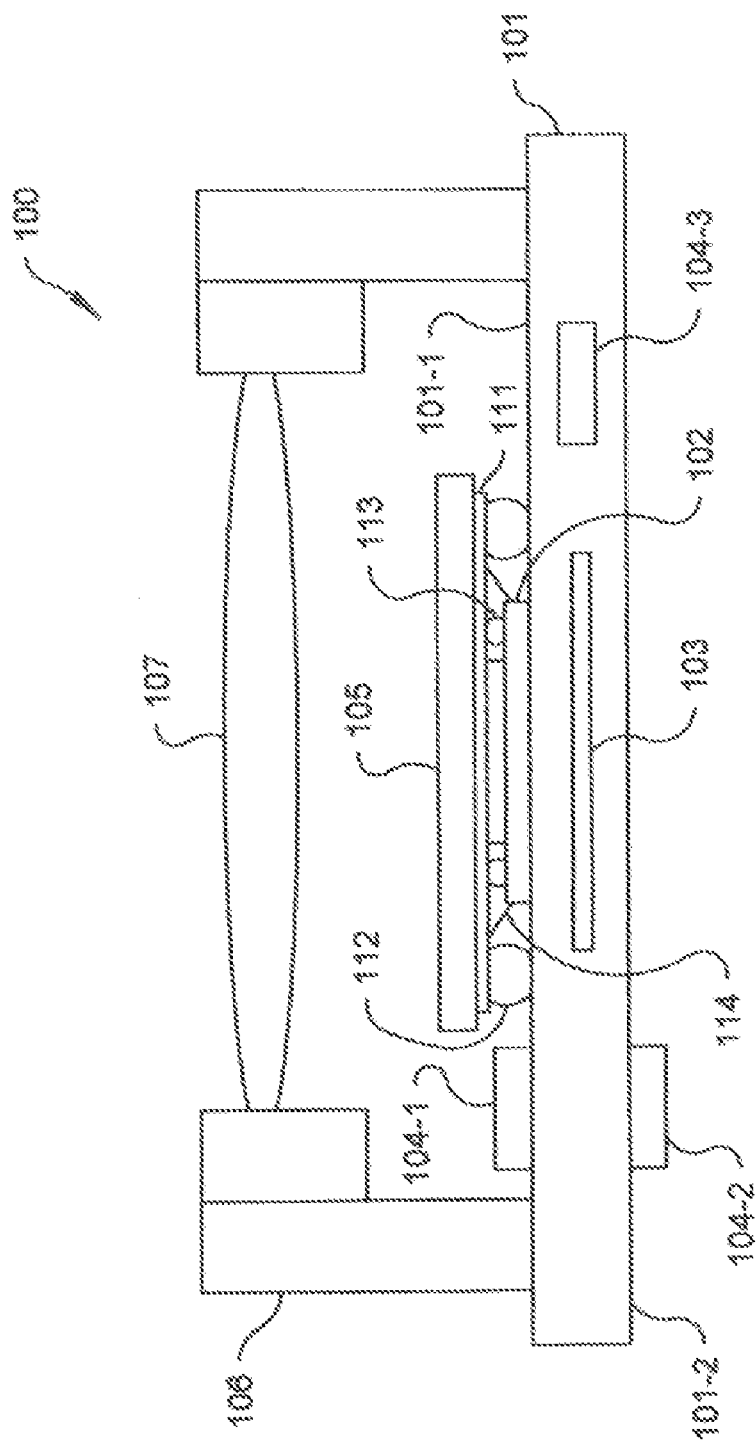
FIG. 5 is a schematic diagram of an image sensor module in accordance with still another embodiment of the present invention.

FIG. 5 is a schematic diagram of an image sensor module 100 in accordance with still another embodiment of the present invention. Referring to FIG. 5, image sensor module 100 includes a first substrate 101, an image sensor device 102, a semiconductor device 103 and passive components 104-1, 104-2 and 104-3. Image sensor device 102 is flip-chip bonded via solder bumps 113 to a second substrate 111, for example, a PCB or an FPC, which is electrically connected to first substrate 101 via solder balls 112 while image sensor device 102 is attached onto first substrate 101. An underfill material 114 is applied between an active surface (not numbered) of image sensor device 102 and second substrate 111 where solder bumps 113 are provided. Substrate 101 includes a multi-layered structure in which semiconductor device 103 and passive component 104-3 are embedded. Passive components 104-1 and 104-2 are formed on a first surface 101-1 and a second surface 101-2 of first substrate 101, respectively. Image sensor device 102 receives an image signal through a lens 107 held by a holder 106 and a third substrate 105, for example, a glass substrate, attached to second substrate 111.

Figure 6C:
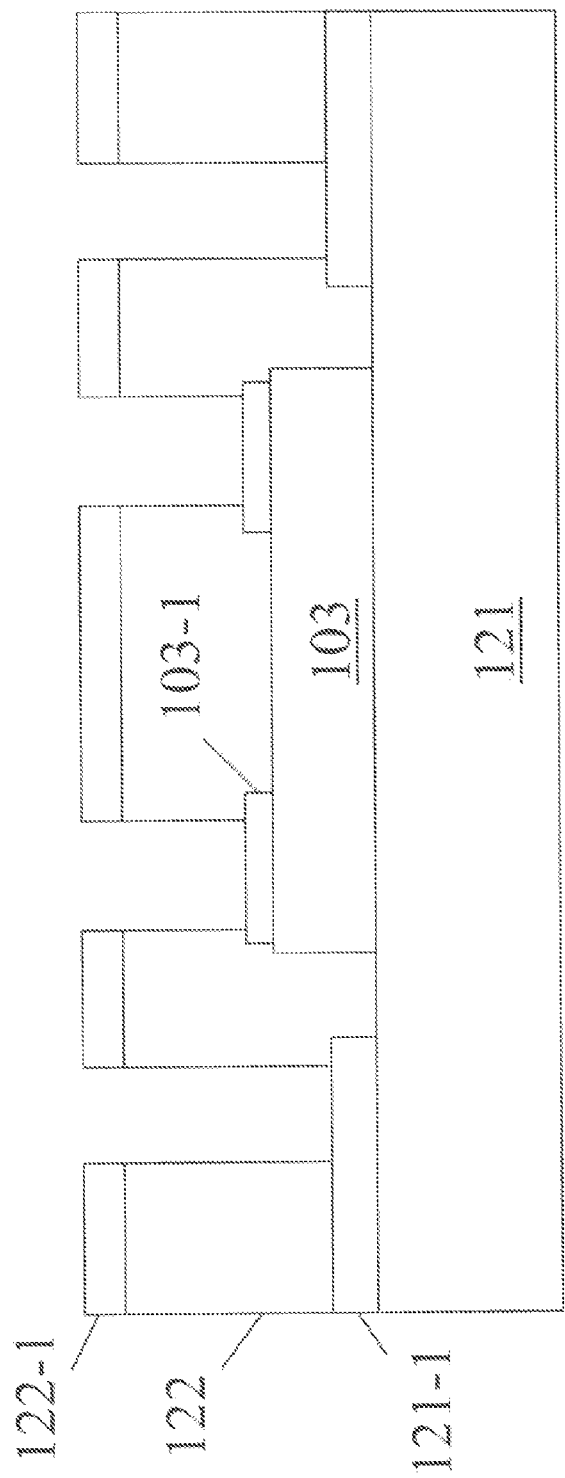

FIGS. 6A to 6D are diagrams illustrating a method for manufacturing a built-in device in accordance with one embodiment of the present invention. Referring to FIG. 6A, a semiconductor device 103 in the form of a die having a first surface (not numbered) grinded to a desired thickness is provided. Conductive pads 103-1 are formed on a second surface (not numbered) of semiconductor device 103. A carrier substrate 121 on which conductive lines 121-1 are formed is provided. In one embodiment of the present invention, semiconductor device 103 has a thickness of approximately 50 µm, and carrier substrate 121 has a thickness ranging from approximately 0.2 mm to 0.8 mm. Semiconductor device 103, which includes one of an ISP, DSP, SRAM or flash memory, is attached onto carrier substrate 121.

Referring to FIG. 6B, a dielectric layer 122 is formed by, for example, lamination, printing or spin-coating, on carrier substrate 121 on which semiconductor device 103 is attached. In one embodiment, an Ajinomoto build-up film ("ABF") to serve as dielectric layer 122 having a thickness of approximately 100 µm is laminated to carrier substrate 121. A conductive layer 122-1, for example, a copper foil having a thickness of approximately 3 to 18 µm, is formed on dielectric layer 122. Dielectric layer 122 includes a material selected from one of polyimide ("PI")), resin-coated copper ("RCC") foil or polypropylene ("PP").

Referring to FIG. 6C, parts of conductive layer 122-1 and dielectric layer 122 are removed by conventional pattering and etching processes. In one embodiment, a ultra-violet ("UV") laser etching is performed to expose conductive lines 121-1 and conductive pads 103-1.

Figure 6D:
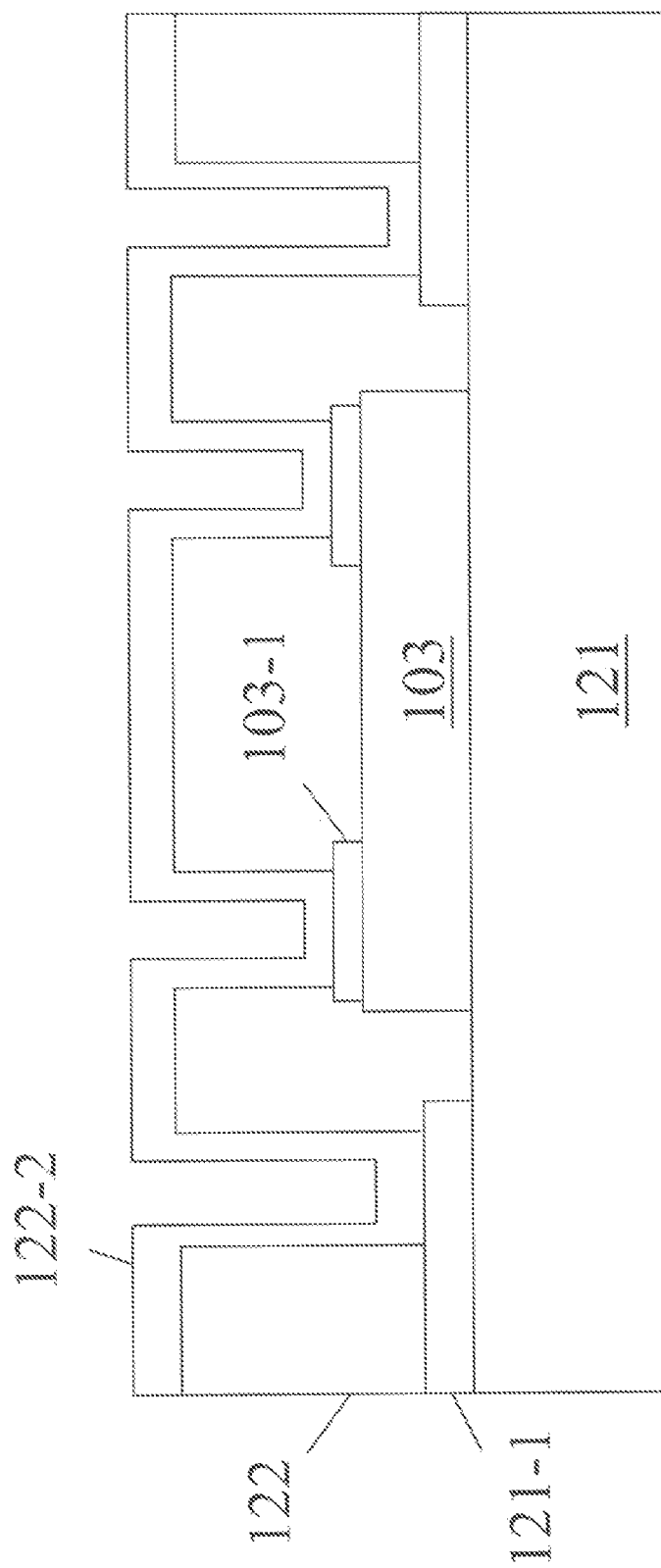

Referring to FIG. 6D, a metallization process is performed to form a conductive layer 122-2, which electrically connects one of conductive pads 103-1 to a corresponding one of conductive lines 121-1. In one embodiment, an electrode plating is conducted to form conductive layer 122-2, for example, a copper layer. Subsequently, if necessary, more conductive layers may be formed over conductive layer 122-2 by repeating the processes shown in FIGS. 6B, 6C and 6D.

Figure 6E:
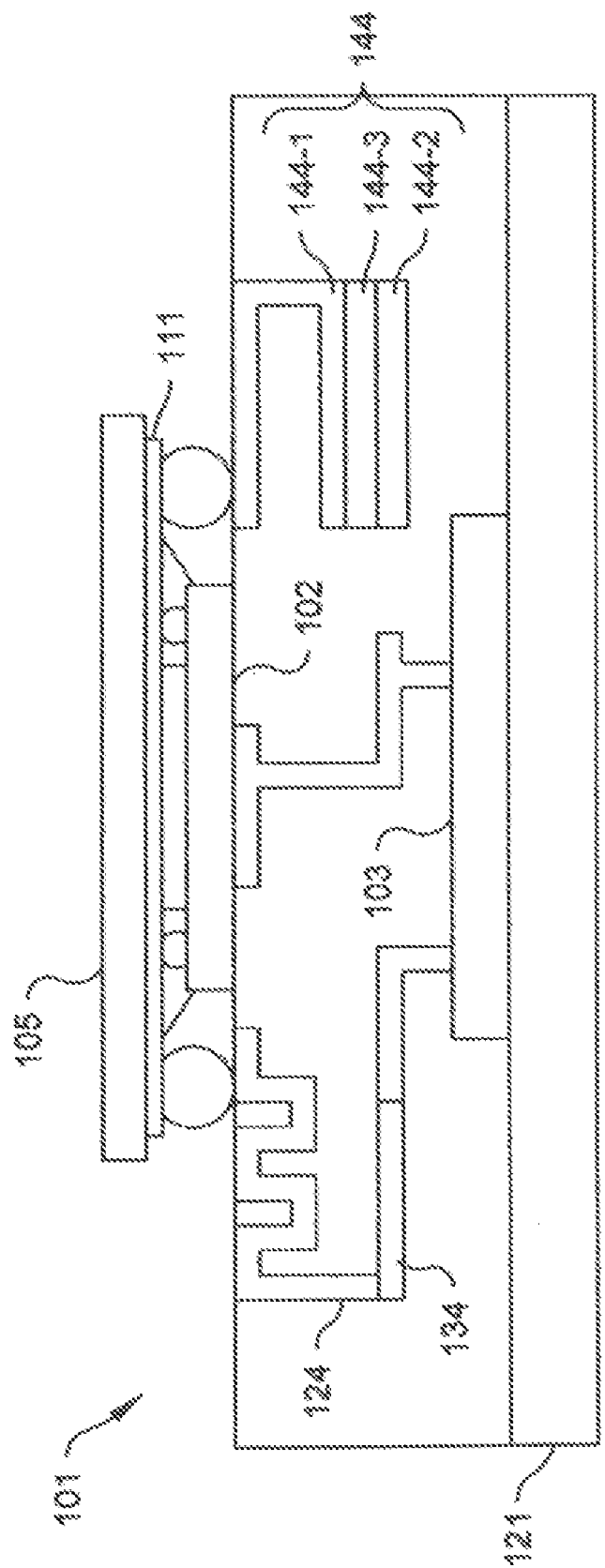
FIG. 6E is a schematic diagram of built-in devices in accordance with one embodiment of the present invention.

FIG. 6E is a schematic diagram of built-in devices in accordance with one embodiment of the present invention. Referring to FIG. 6E, in addition to semiconductor device 103, passive components 124, 134 and 144 are formed within first substrate 101. Passive component 124 includes an inductor in the form of a horizontal or vertical spiral of a conductive path. The inductance of passive component 124 may be changed by adding a material of different permeability to the conductive path. Passive component 134 includes a resistor. The resistance of passive component 134 may be changed by adding a material of a different resistivity to a conductive path or by controlling the size of a conductive path. Passive component 144 includes a capacitor, which further includes a first electrode 144-1, a second electrode 144-2 and a dielectric layer 144-3 formed between first and second electrodes 144-1 and 144-2. The capacitance of passive component 144 may be changed by changing the permittivity of dielectric layer 144-3.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A method for packaging an image sensor module, comprising:
   providing a first substrate;
   providing a second substrate;
   flip-chip bonding an image sensor device to the second substrate for receiving an image signal; and
   embedding a semiconductor device in the first substrate for processing the image signal from the image sensor device, wherein said embedding the semiconductor in the first substrate further comprises:
   attaching the semiconductor device onto a carrier substrate;
   forming a dielectric layer on the carrier substrate;
   exposing parts of the semiconductor device and the carrier substrate; and
   electrically connecting a conductive pad of the semiconductor device to a conductive line on the carrier substrate.

2. The method of claim 1, further comprising providing at least one passive component on a surface of the first substrate.

3. The method of claim 1, further comprising embedding at least one passive component in the first substrate.

4. The method of claim 1, further comprising attaching a transparent substrate to the second substrate.

5. A method for packaging an image sensor module, comprising:
   providing a first substrate;
   attaching a semiconductor device onto the first substrate;
   forming a dielectric layer on the first substrate attached with the semiconductor device;
   patterning and etching the dielectric layer to expose parts of the first substrate and the semiconductor device;
   forming a conductive layer on the dielectric layer to cover at least one of the exposed parts;
   providing a second substrate;
   flip-chip bonding an image sensor device to the second substrate; and electrically connecting the image sensor and the semiconductor device.

6. The method of claim 5, further comprising providing at least one passive component on a surface of the first substrate.

7. The method of claim 5, further comprising embedding at least one passive component within the first substrate.

8. The method of claim 5, further comprising attaching a transparent plate to the second substrate.

* * * * *